United States Patent [19]

New

[11] Patent Number: 5,502,440
[45] Date of Patent: Mar. 26, 1996

[54] STRUCTURE AND METHOD FOR PERFORMING ANALOG TO DIGITAL CONVERSION

[76] Inventor: Bernard J. New, 142 Stacia St., Los Gatos, Calif. 95032

[21] Appl. No.: 300,280

[22] Filed: Sep. 2, 1994

[51] Int. Cl.⁶ .................................................. H03M 1/60
[52] U.S. Cl. ................................................. 341/157
[58] Field of Search .................................. 341/157, 164, 341/169, 144

[56] References Cited

U.S. PATENT DOCUMENTS 3,997,892  12/1976  Susset ...................................... 341/144

OTHER PUBLICATIONS

Kevin Daugherty, "Microcontroller-Based Design Uses Minimal Support ICs and Code to Get High-Accuracy Analog-To-Digital Conversion-Try Single-Slope A-D Conversion for a Low-Cost 12-Bit Solution", p. 59–Electronic Design, Jan. 23, 1992.

*Primary Examiner*—Brian K. Young
*Attorney, Agent, or Firm*—Norman R. Klivans; Eric Hoffman; Edel M. Young

[57] ABSTRACT

A structure and method of performing an analog-to-digital conversion uses a voltage generator which generates an analog reference signal in response to a clock signal. The analog reference signal is a ramp signal which varies between two on-chip supply voltages. A voltage divider circuit receives an analog input signal to be digitized and the analog reference signal. The voltage divider circuit creates an analog control signal equal to the sum of a predetermined fraction of the analog input signal and a predetermined fraction of the analog reference signal. The analog control signal is provided to a first digital buffer and the analog reference signal is provided to a second digital buffer. The first and second digital buffers provide digital control signals having a first logic state when the applied input signal is less than a threshold voltage and having a second logic state when the applied input signal is greater than the threshold voltage. A digital logic circuit receives the digital control signals from the first and second digital buffers and the above-mentioned clock signal. In response, the digital logic circuit generates a digital output signal representative of the analog input signal.

28 Claims, 13 Drawing Sheets

STRUCTURE AND METHOD FOR PERFORMING ANALOG TO DIGITAL CONVERSION

BACKGROUND OF THE INVENTION

1. Field of the Invention

The present invention relates to a structure and method for approximating an analog signal with a digital signal. In particular, the present invention relates to an analog to digital converter for use in a digital integrated circuit.

2. Description of the Prior Art

Certain integrated circuits are fabricated to include only digital circuitry. These integrated circuits are referred to as digital integrated circuits. Examples of digital integrated circuits include field programmable gate arrays (FPGAs) and programmable logic arrays (PLAs). It is more expensive to fabricate analog circuit elements on a digital integrated circuit. Therefore, when an analog circuit must be used in conjunction with a digital integrated circuit, the analog circuitry is sometimes fabricated on a separate chip using a separate process. This increases the cost and size of a system which utilizes both the digital integrated circuit and the analog circuitry.

An analog-to-digital converter (ADC) is a hybrid circuit which includes both analog and digital circuitry. Such ADCs are sometimes used in connection with an FPGA. FPGAs are standard programmable integrated circuits which include predetermined resources, each able to perform many functions in response to a user command. However, ADC's are not available as one of these functions. As previously discussed, forming the analog circuitry of the ADC on the FPGA would be inconvenient and expensive. Consequently, prior art ADCs used in connection with FPGAs are typically fabricated on a separate chip.

FIG. 1 is a schematic diagram of a prior art ADC 1. ADC 1 includes counter 2, digital-to-analog converter (DAC) 3, analog comparator 4 and register 5. Counter 2 counts up from a minimum count to a maximum count and then resets and repeats the count. DAC 3 receives the count of counter 2 and in response generates an analog ramp signal which is representative of this count. Analog comparator 4 compares the analog ramp signal with the input signal ($V_{IN}$). When the analog ramp signal becomes greater than input signal $V_{IN}$, analog comparator 4 provides a signal which enables register 5 to receive the current count of counter 2. This current count is provided as a digital output signal ($V_{OUT}$) on bus 6.

Analog comparator 4 is an analog circuit. Thus, when utilizing ADC 1 in connection with an FPGA, analog comparator 4 is typically fabricated on a separate chip. As a result, the cost of the system utilizing the digital integrated circuit is increased.

It is therefore desirable to have an ADC which does not require an analog comparator. It is also desirable to have an ADC which is capable of being fabricated with a significant number of elements on a digital integrated circuit chip and a minimum number of external elements.

SUMMARY OF THE INVENTION

In accordance with one embodiment of the present invention, an ADC is provided for use in a digital system having a threshold voltage. The ADC receives an analog input signal, and in response, generates a digital output signal. The ADC includes a voltage generator which generates an analog reference signal in response to a clock signal. In one embodiment, the analog reference signal is a linearly increasing ramp signal which varies between two on-chip supply voltages. The analog input signal and analog reference signal are coupled to a voltage divider circuit. In response, the voltage divider circuit creates an analog control signal equal to the sum of a predetermined fraction the analog input signal and a predetermined fraction of the analog reference signal.

The analog reference signal and analog control signal are provided to first and second digital buffers, respectively. The first digital buffer provides a first digital control signal having a first logical state when the analog reference signal is less than a threshold value and having a second logical state when the analog reference signal is greater than the threshold value. Similarly, the second digital buffer provides a second digital control signal having a first logical state when the analog control signal is less than the threshold voltage and having a second logical state when the analog control signal is greater than the threshold voltage. The first and second digital control signals and the clock signal are provided to a digital logic circuit. In response, the digital logic circuit generates a digital output signal representative of the analog input signal.

In one embodiment, the digital logic circuit is a programmable counter which performs a count in response to the first and second digital control signals to determine the values of the digital output signal. In another embodiment, the digital logic circuit determines the count values at which the first and second digital control signals transition from low states to high states and algebraically determines the values of the digital output signal.

Counter Embodiment

In the counter embodiment, the digital logic circuit operates as a programmable counter to calculate the digital output signal. This programmable counter operates in accordance with a first instruction when the first and second digital control signals are at the first logical state.

When the first digital control signal is at the first logical state and the second digital control signal is at the second logical state, the programmable counter is operated in accordance with a second instruction. When the first digital control signal is at the second logical state and the second digital control signal is at the first logical state, the programmable counter is operated in accordance with a third instruction. When the first and second digital control signals are at the second logical state, the programmable counter is operated in accordance with a fourth instruction.

The four instructions are selected such that the final count of the programmable counter is a value representative of the analog input signal. Factors which affect the selection of the four instructions include: the characteristics of the analog reference signal and the voltage divider circuit and the magnitude of the threshold voltage.

In one embodiment, the first instruction causes the programmable counter to increment by one during each clock cycle, the second instruction causes the programmable counter to increment by two during each clock cycle, the third instruction causes the programmable counter to decrement by one during each clock cycle, and the fourth instruction causes the programmable counter to stop counting.

In another embodiment, the first instruction causes the programmable counter to increment by one during each clock cycle, the second instruction causes the programmable counter to increment by three during each clock cycle, the third instruction causes the programmable counter to decrement by two during each clock cycle, and the fourth instruction causes the programmable counter to stop counting. Many other combinations are possible.

Algebraic Embodiment

In the algebraic embodiment of the present invention, the digital logic circuit algebraically determines the values of the digital output signal. In this embodiment, the analog reference signal is generated in response to a count signal which has a plurality of count values. These count values are also provided to first and second storage devices in the digital logic circuit. When the first digital control signal transitions to a logic high state, the current count value is latched into the first storage device as a first count value. Similarly, when the second digital control signal transitions to a logic high state, the current count value is latched into the second storage device as a second count value. The first and second count values are multiplied by first and second factors, respectively, to create first and second multiplied count values, respectively. These first and second multiplied count values are algebraically combined to define a value of the digital output signal.

Because an ADC in accordance with the present invention does not require an analog comparator, this ADC is capable of being fabricated with a significant number of elements on a digital integrated circuit chip and a minimum number of external elements. In one embodiment of the present invention, the entire ADC is fabricated on the same chip as a digital integrated circuit.

The present invention will be more fully understood in view of the following drawings taken together with the detailed description.

DETAILED DESCRIPTION OF THE INVENTION

Figure 2:
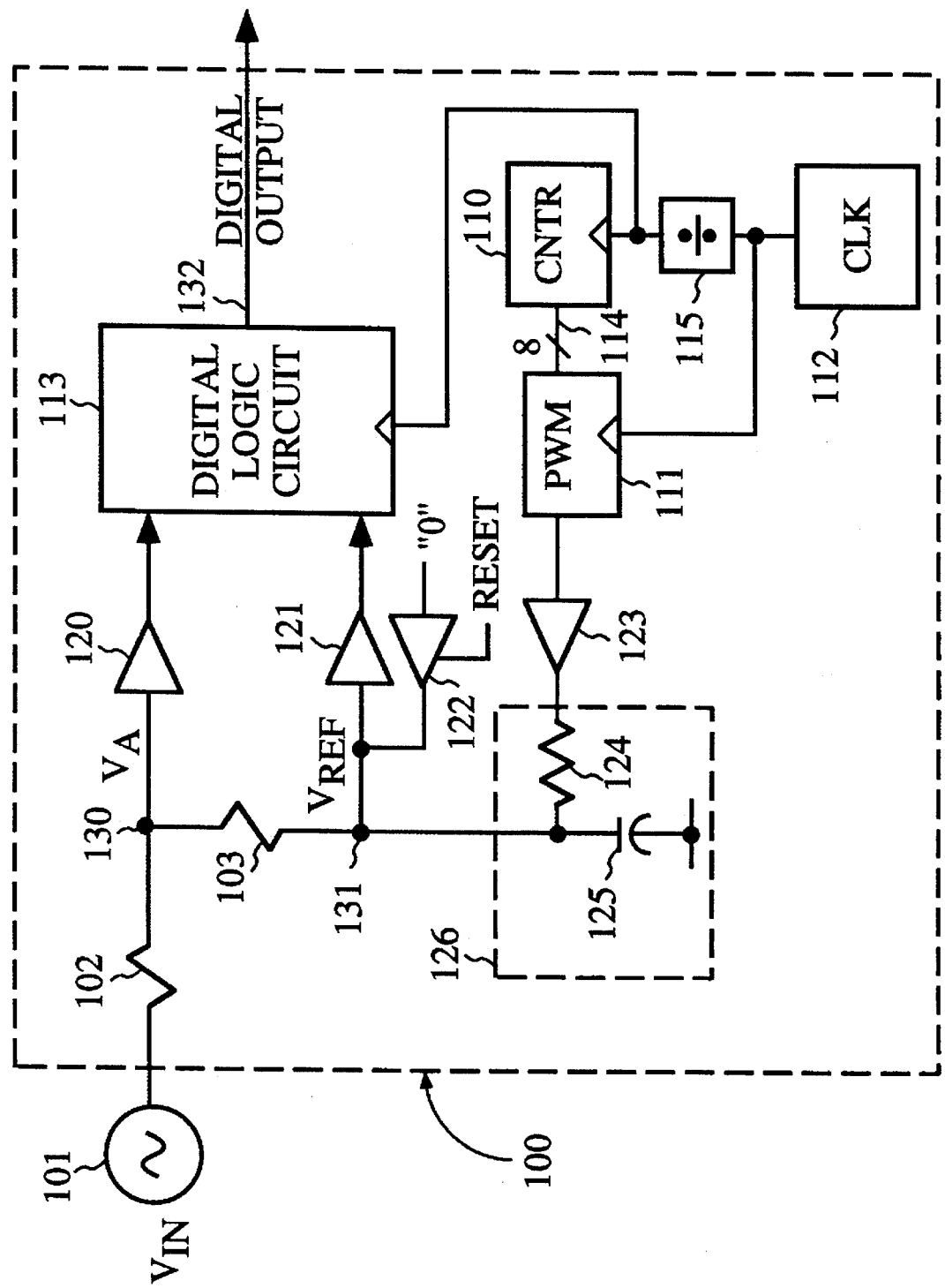
FIG. 2 is a schematic diagram of an ADC in accordance with one embodiment of the present invention.

FIG. 2 is a schematic diagram of ADC 100 in accordance with one embodiment of the present invention. ADC 100 includes resistors 102 and 103, digital input buffers 120–121, digital output buffers 122–123, counter 110, pulse width modulator 111, clock signal generator 112, digital logic circuit 113, programmable clock divider circuit 115 and R-C integrator 126 (which includes resistor 124 and capacitor 125). In one embodiment of the present lo invention, the previously mentioned elements, with the exception of resistors 102, 103 and R-C integrator 126, are formed on a single digital integrated circuit chip. In this embodiment, buffers 120 and 121 are typically coupled to input pins of the chip and buffers 122–123 are typically coupled to output pins of the chip. In an alternate embodiment, all of the above-listed elements of ADC 100 are formed on the same digital integrated circuit chip. ADC 100 converts an analog input signal $V_{IN}$ from analog voltage source 101 to a digital signal represented by a predetermined number of digital values. This digital signal is provided at output bus 132.

In one embodiment of the present invention, counter 110 is a conventional 8-bit counter having a minimum count of zero (0000 0000) and a maximum count of 255 (1111 1111). Counter 110 receives a system clock signal which is generated by clock signal generator 112 and divided down by programmable divider circuit 115. The count of counter 110 is incremented by one during each cycle of the system clock signal. After the count reaches 255, counter 110 overflows to zero and re-counts. The count of counter 110 is provided to PWM 111 on bus 114 as an output count signal.

Figure 3:
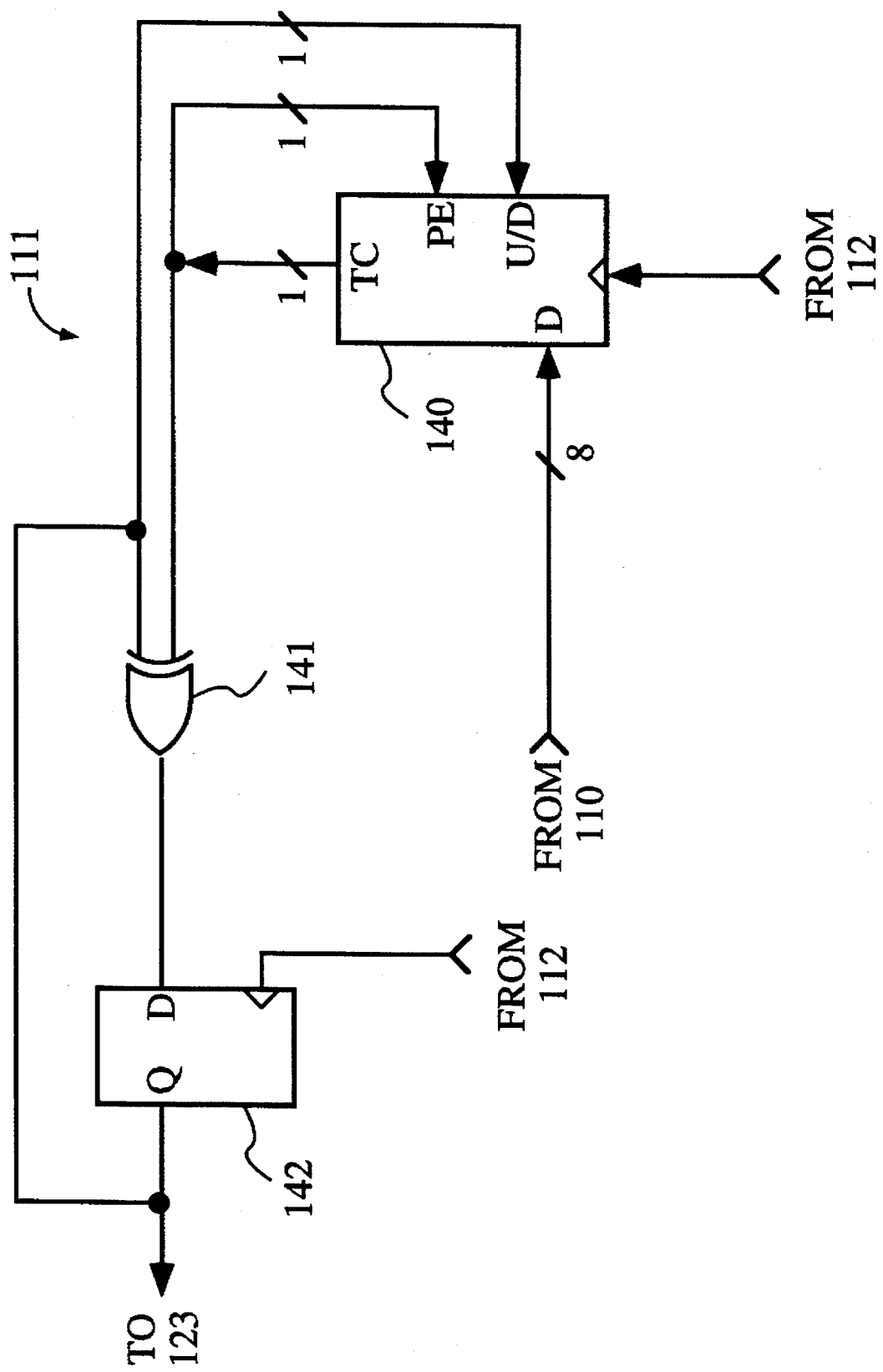
FIG. 3 is a schematic diagram of one embodiment of the pulse width modulator illustrated in FIG. 2.

FIG. 3 is a schematic diagram of one embodiment of PWM 111. PWM 111 includes conventional 8-bit up/down counter 140, exclusive OR gate 141 and flip-flop 142. The output count signal generated by counter 110 is provided to the data (D) input terminal of up/down counter 140. Up/down counter 140 is clocked by the clock signal generated by clock signal generator 112. A terminal count (TC) output lead of up/down counter 140 is coupled to a first input lead of exclusive OR gate 141 and to a parallel enable (PE) input lead of up/down counter 140. The output terminal of exclusive OR gate 141 is coupled to the D input terminal of flip-flop 142. The Q output terminal of flip-flop 142 is coupled to the second input lead of exclusive OR gate 141 and to an up/down (U/D) input lead of up/down counter 140. Flip-flop 142 is clocked by the clock signal generated by clock signal generator 112.

Up/down counter 140 operates as follows. The signal at the TC output terminal is asserted high for one clock cycle each time up/down counter 140 reaches its minimum value (0000 0000) or maximum value (1111 1111). When a logic high signal is provided to the PE input terminal, the count signal asserted on the D input terminal is read into up/down counter 140 during the subsequent clock cycle. Up/down counter 140 then continues counting from a count corresponding to this count signal. When the signal provided to U/D input terminal changes state, the direction of counter 140 is reversed (i.e., from incrementing to decrementing, or vice versa).

Figure 4:
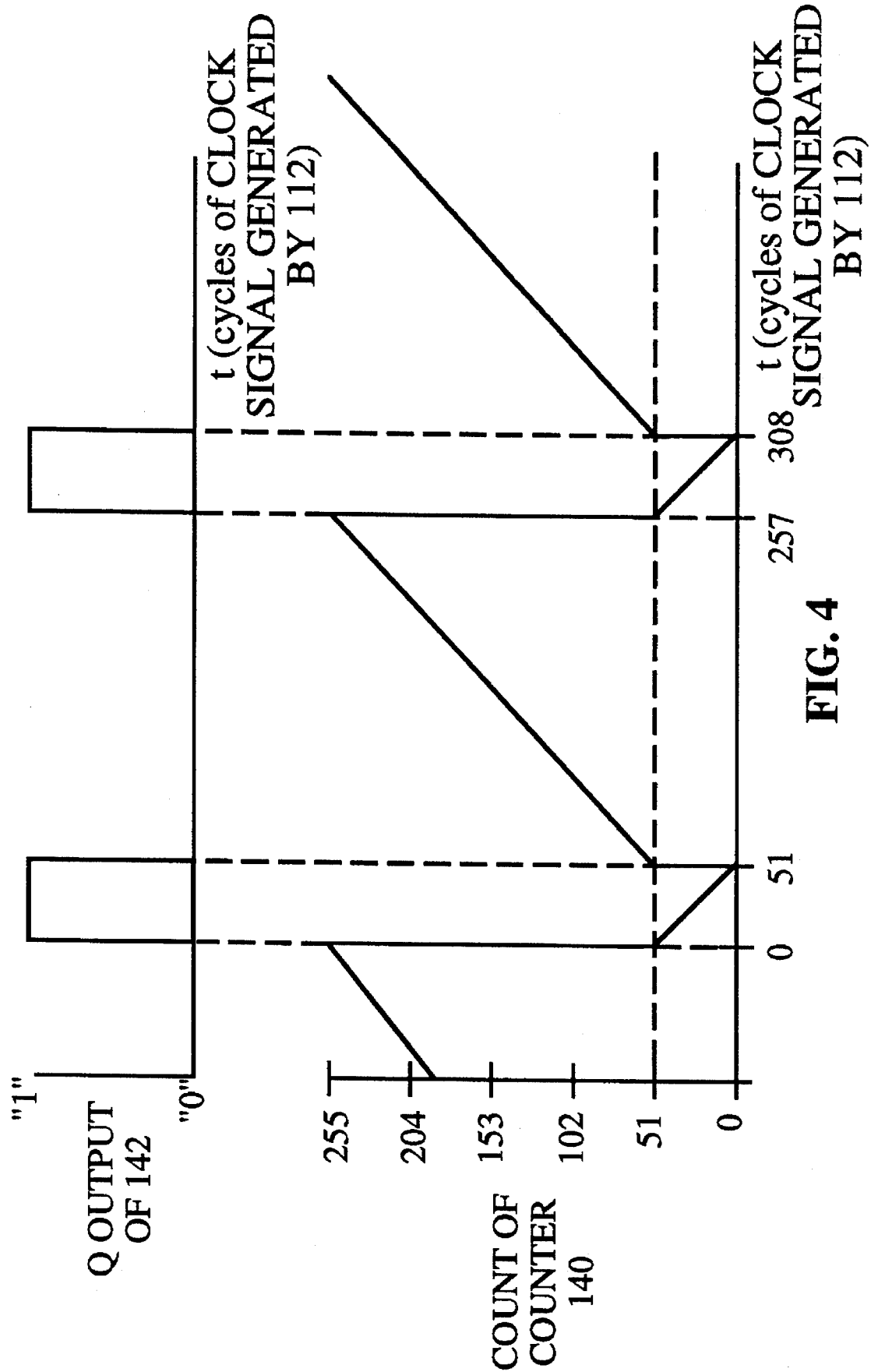
FIG. 4 is a waveform diagram illustrating waveforms generated during the operation of the pulse width modulator of FIG. 3.

FIG. 4 is a waveform diagram illustrating waveforms generated during the operation of PWM 111.

Initially, as up/down counter 140 counts up to its maximum value of 255, the signal at the TC output lead and the signal at the Q output terminal of flip-flop 142 are both at logic low levels. When up/down counter 140 reaches its maximum count of 255, the signal at the TC output terminal is asserted high for one clock cycle. During this clock cycle, the output signal of exclusive OR gate 141 transitions to a logic high level. This logic high signal is written to flip-flop 142 during the subsequent clock cycle. The logic high signal at the TC output terminal is also transmitted to the PE input terminal of up/down counter 140, thereby causing the output count signal from counter 110 to be written to the D input terminal of up/down counter 140 during the next clock cycle. In the example illustrated in FIG. 4, the output count signal has a value of "51".

After the logic high signal is written to flip-flop 142, the signal at the Q output terminal of flip-flop 142 transitions to a logic high level, thereby toggling the signal provided to the U/D input terminal of up/down counter 140. As a result, the count direction of up/down counter 140 is toggled. Consequently, up/down counter 140 begins counting downward from the value of the output count signal (e.g., "51"). When the count of up/down counter 140 reaches zero, the signal at the TC output terminal is asserted high for one clock cycle. During this clock cycle, the output signal of exclusive OR gate 141 is at a logic low level. This logic low signal is written to flip-flop 142 during the next clock cycle. The high signal at the TC output terminal is also asserted on the PE input terminal of up/down counter 140, thereby causing the output count signal from counter 110 to be written to the D input terminal of up/down counter 140 during the subsequent clock cycle. Also during the subsequent clock cycle, the signal on the Q output terminal of flip-flop 142 transitions to a logic low state, again toggling the count direction of the up/down counter 140. Up/down counter 140 then counts upward from 51 to 255. The process is then repeated as previously described.

As a result, the signal generated at the Q output terminal of flip-flop 142 has a constant amplitude and frequency. However, the number of counts during which the signal at the Q output terminal is in a logic high state (i.e., the width of the pulse) is proportional to the value of the output count signal received from counter 110. Thus, in the example previously described, the signal at the Q output terminal is in a logic high state for 51 of the 257 counts which make up each cycle of up/down counter 140. Each cycle of up/down counter 140 has 257 counts because the count loaded into up/down counter 140 (e.g., "51") is counted twice each cycle.

Programmable divider circuit 115 is selected such that PWM 111 generates several pulses each time the output count signal of counter 110 is incremented. For example, if divider circuit 115 is programmed such that the clock signal provided to PWM 111 is 1028 times faster than the clock signal provided to counter 110, PWM will generate four pulses for each count of counter 110.

The pulses generated by PWM 111 are transmitted through buffer 123 (FIG. 2) to an R-C integrator 126 formed by resistor 124 and capacitor 125. R-C integrator 126 averages the voltage pulses received from PWM 111 to produce an analog reference voltage signal $V_{REF}$ at node 131. The values of resistor 124 and capacitor 125 are selected such that analog reference signal $V_{REF}$ is a low-distortion ramp signal which is proportional to the count signal generated by counter 110. In this manner, PWM 111, resistor 124 and capacitor 125 operate as a DAC which receives a digital signal from counter 110 and provides an analog signal at node 131.

Figure 1:
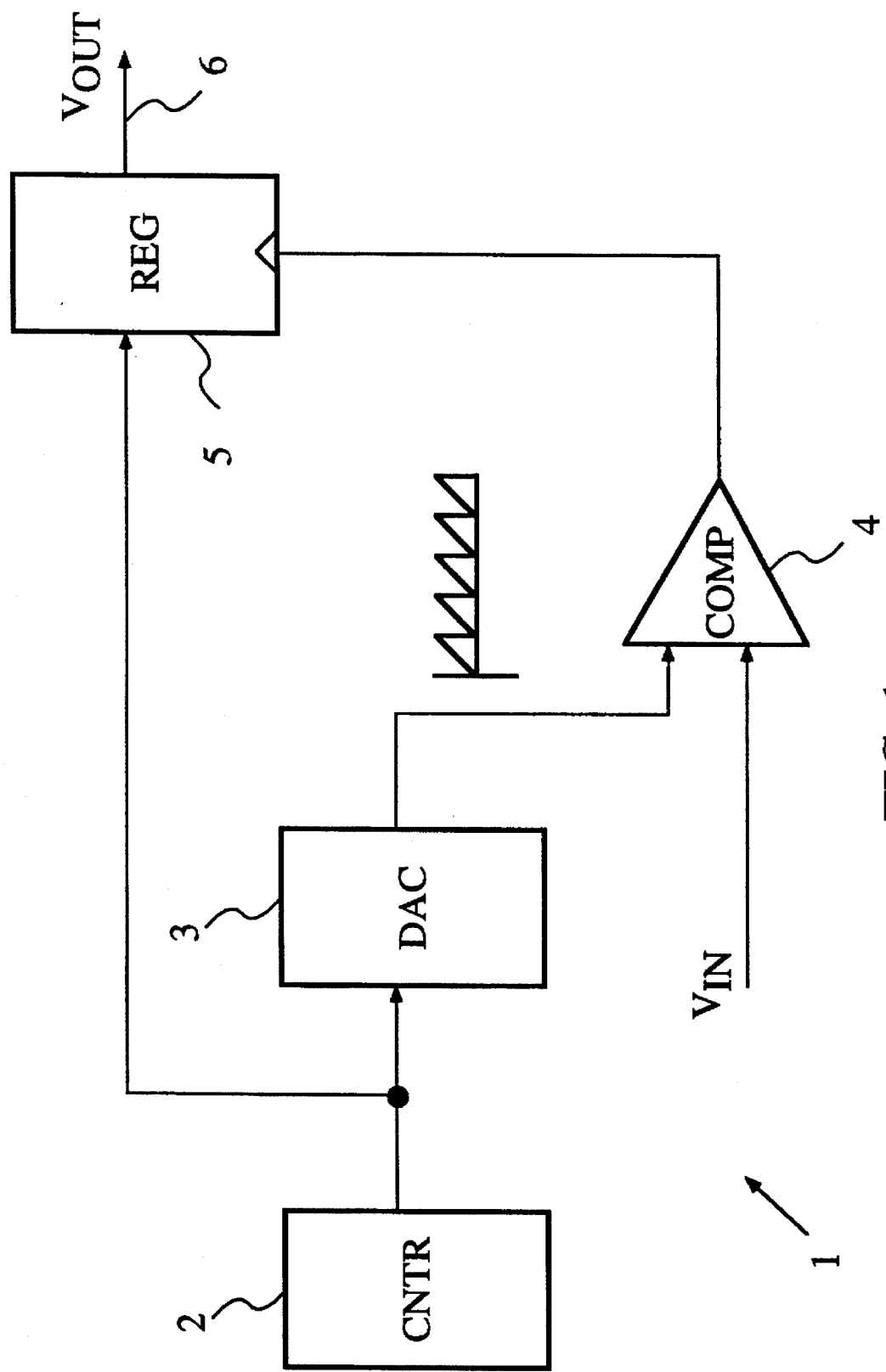
FIG. 1 is a schematic diagram of a prior art ADC.
Figure 5:
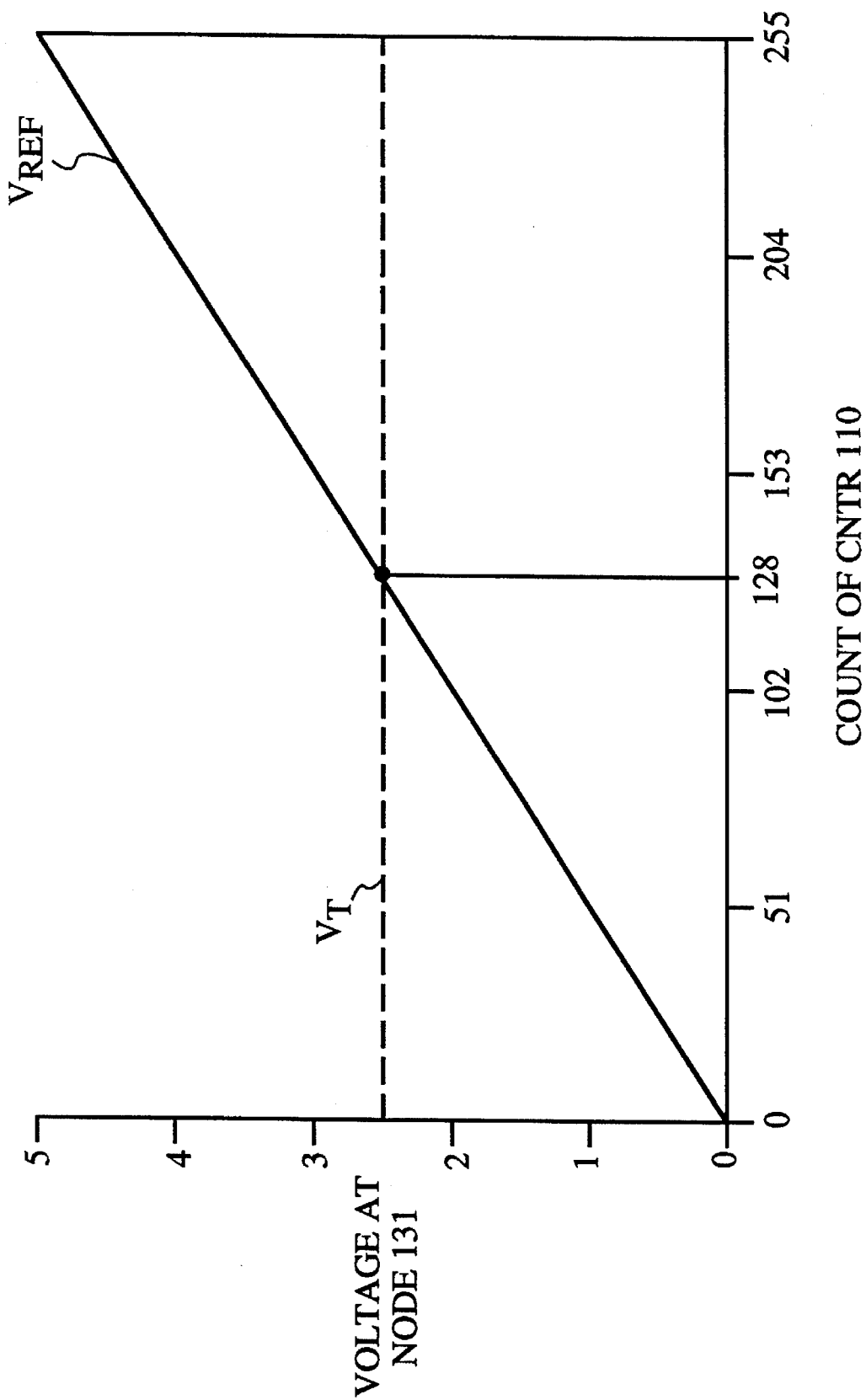
FIG. 5 is a waveform diagram of one embodiment of an analog reference signal $V_{REF}$.

FIG. 5 is a waveform diagram of one embodiment of analog reference signal $V_{REF}$. $V_{REF}$ is a ramp signal which has a voltage equal to a first chip supply voltage (e.g., ground) when the output count signal of counter 110 is at a zero count. $V_{REF}$ increases linearly to a second chip supply voltage $V_{CC}$ (e.g., 5 volts) when the output count signal of counter 110 is at a value of 255. After counter 110 reaches the maximum count of 255, a reset signal momentarily enables tri-state buffer 122 (FIG. 1) to pass a "zero" value, thereby accelerating the discharge of capacitor 125.

Analog reference signal $V_{REF}$ is provided to buffer 121 (FIG. 2). Buffer 121 is a conventional buffer which receives an analog input signal and provides a digital control signal. The digital control signal of buffer 121 is a logic high signal if the analog input signal to the buffer is greater than a threshold voltage $V_T$ of the buffer. Conversely, the digital control signal will be a logic low signal if the analog input signal to the buffer is less than threshold voltage $V_T$. In FIG. 5, the threshold voltage $V_T$ is illustrated as 2.5 volts. The digital control signal of buffer 121 therefore transitions to a logic high state when the analog reference signal $V_{REF}$ exceeds 2.5 volts. This occurs when the count of counter 110 exceeds half of the maximum count (i.e., at count 128). The output signal of buffer 121 is provided to digital logic circuit 113.

Analog voltage source 101 (FIG. 2) is connected to node 130 through resistor 102. Node 130 is also connected to node 131 through resistor 103 and to digital logic circuit 113 through buffer 120. Buffer 120 is substantially identical to buffer 121. Resistors 102 and 103 form a voltage divider which results in an analog control signal $V_A$ at node 130. Analog control signal $V_A$ is equal to:

$$(R_{103}*V_{IN}+R_{102}*V_{REF})/(R_{102}+R_{103}),$$

where $R_{102}$ and $R_{103}$ are the resistances of resistors 102 and 103, respectively. Thus, the analog control signal $V_A$ is equal to the sum of a predetermined fraction (i.e., $R_{103}/(R_{102}+R_{103})$) of the analog input signal and a predetermined fraction (i.e., $R_{102}/(R_{102}+R_{103})$) of the analog reference signal. In one embodiment of the present invention, resistors 102 and 103 are equal-value resistors. In such an embodiment, analog control signal $V_A$ is equal to one half of the sum of $V_{IN}$ and $V_{REF}$. Analog control signal $V_A$ is provided to buffer 120. The digital control signal of buffer 120 is a logic high signal if the analog control signal $V_A$ is greater than threshold voltage $V_T$. Conversely, the digital control signal of buffer 120 is a logic low signal if the analog control signal $V_A$ is less than threshold voltage $V_T$. The output signal of buffer 120 is provided to digital logic circuit 113.

In addition to receiving the output signals from buffers 120 and 121, digital logic circuit 113 receives the same system clock signal as counter 110. Thus, digital lo logic circuit 113 is synchronized with counter 110. As described in more detail below, digital logic circuit 113 is programmed to operate such that the output signal of digital logic circuit 113 at the end of each cycle of counter 110 is a digital number representative of the analog input signal $V_{IN}$. For example, if analog input signal $V_{IN}$ has a voltage of 3 volts during a cycle of counter 110, digital logic circuit 113 provides a digital output of 153 (3 volts/5 volts * 255).

If "A" is defined as the count of counter 110 at which ½ $(V_{IN}+V_{REF})$ exceeds threshold voltage VT, "B" is defined as the count of counter 110 at which the analog reference voltage $V_{REF}$ exceeds the threshold voltage $V_T$, and "C" is defined as the count of counter 110 which is representative of the digital value of $V_{IN}$, then:

$$C=2*b-A$$

Digital logic circuit 113 is therefore programmed in accordance with this equation.

Figure 6:
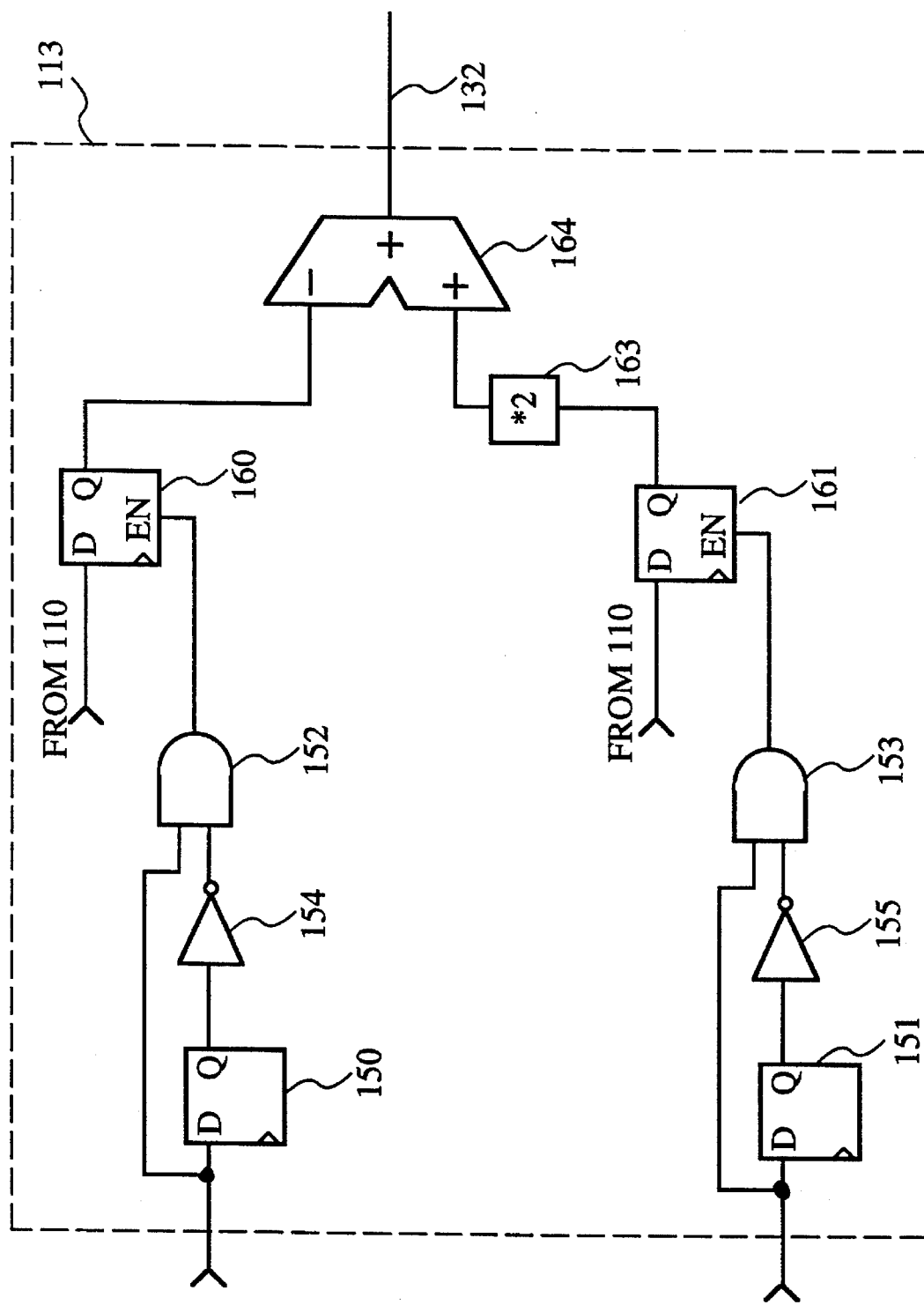
FIG. 6 is a schematic diagram of one embodiment of the digital logic circuit of FIG. 2.

FIG. 6 is a schematic diagram of one embodiment of digital logic circuit 113. In this embodiment, the output signals from buffers 120 and 121 are provided to the D input terminals of flip-flops 150 and 151, respectively, and to input leads of AND gates 152 and 153, respectively. The Q output terminals of flip-flops 150 and 151 are transmitted through inverters 154 and 155, respectively, to input leads of AND gates 152 and 153, respectively. The output signals from AND gates 152 and 153 are provided to the enabling input terminals of flip-flops 160 and 161, respectively. The output count signal from counter 110 is provided to the D input terminals of flip-flops 160 and 161. The Q output terminal of flip-flop 160 is coupled to the subtrahend input terminal of subtracting circuit 164. The Q output terminal of flip-flop 161 is coupled to the minuend input terminal of subtracting circuit 164 through a multiply-by-two circuit 163. The output terminal of subtracting circuit 164 is connected to output bus 132. Flip-flops 150–151 and 160–161 are all clocked by the system clock signal generated by clock signal generator 112 and divided down by divider circuit 115.

The above described circuitry operates as follows. When the analog reference signal $V_A$ exceeds the threshold voltage $V_T$, the output signal of buffer 120 transitions from a low state to a high state, thereby causing the output signal of AND gate 152 to transition to a high state for one clock cycle. The high output signal from AND gate 152 enables the current count of counter 110 to be written to flip-flop 160. This count is equal to count "A" as defined above. Count "A" is provided from the Q output terminal of flip-flop 160 to the subtrahend input terminal of subtracting circuit 164.

When the analog reference signal $V_{REF}$ exceeds the threshold voltage $V_T$, the output signal of buffer 121 transitions from a low state to a high state, thereby causing the output signal of AND gate 153 to transition to a high state for one clock cycle. During this clock cycle, the output signal of AND gate 153 enables flip flop 163 to receive the current count of counter 110. This current count is equal to count "B" as described above. Count "B" is multiplied by two by multiply-by-two circuit 163. The output signal from multiply-by-two circuit 163 (i.e., 2 *B) is provided to the minuend input terminal of subtraction circuit 164. Subtraction circuit 164 creates an output signal "C" which is equal to 2*B-A. Thus, the digital logic circuit 113 illustrated in FIG. 6 operates in accordance with the equation C=2*B-A. The output signal "C" is transmitted to output bus 132.

Figure 7:
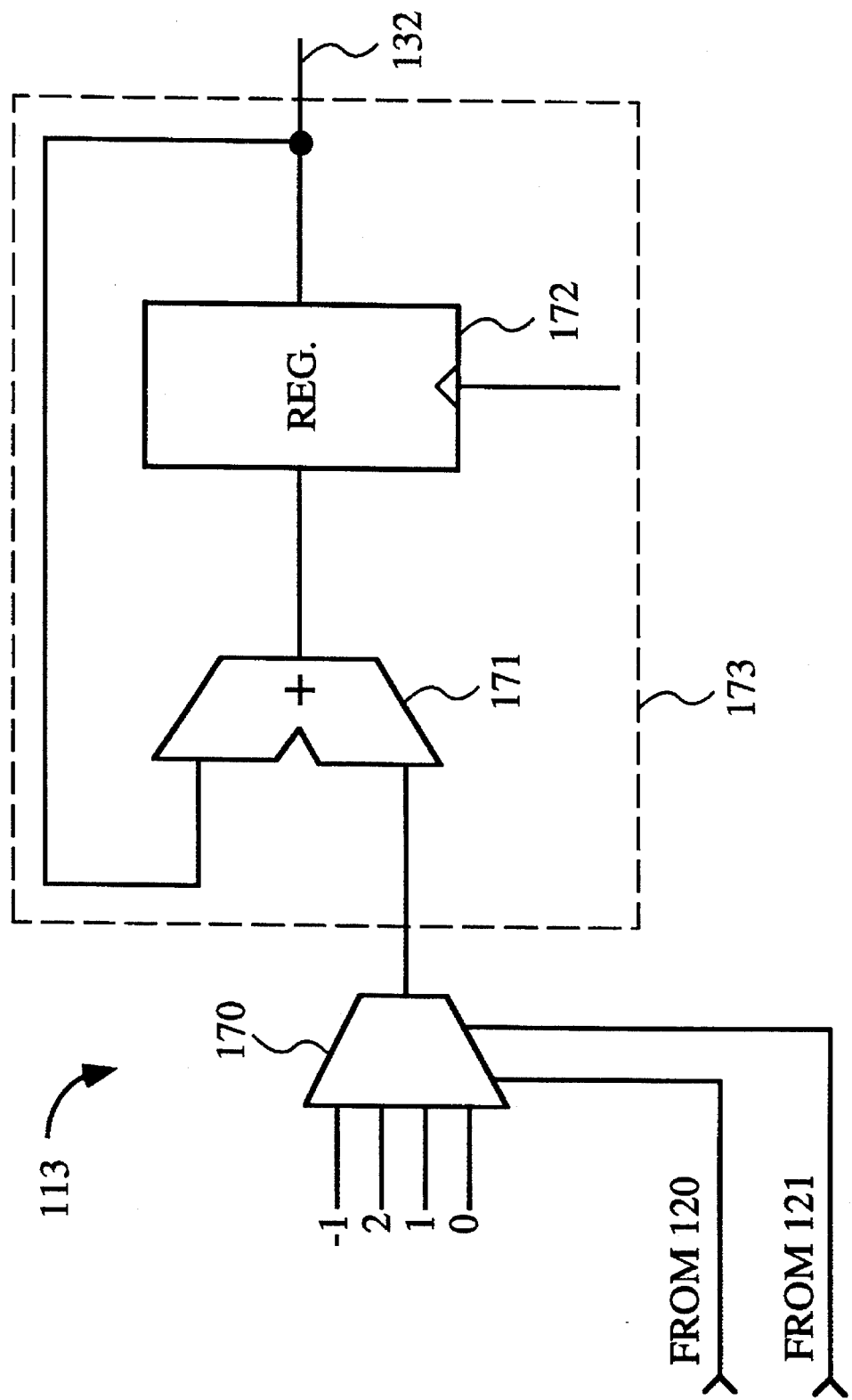
FIG. 7 is a schematic diagram of an alternate embodiment of the digital logic circuit of FIG. 2.

FIG. 7 is a schematic diagram of an alternate embodiment of digital logic circuit 113. In this embodiment, digital logic circuit 113 operates as a programmable counter which includes programmable multiplexer 170, adder circuit 171 and register 172. Adder circuit 171 and register 172 form counter circuit 173. Programmable multiplexer 170 is coupled to the output leads of buffers 120 and 121. Four input signals having values of zero, one, two and minus one are applied to separate input leads of programmable multiplexer 170. The output terminal of multiplexer 170 is coupled to an input terminal of adder circuit 171. The output terminal of adder circuit 171 is coupled to an input terminal of register 172. The output terminal of register 172 is coupled to an input terminal of adder circuit 171 and to output bus 132. Register 172 is clocked by the system clock signal generated by clock signal generator 112 and divided down by divider circuit 115.

Programmable multiplexer 170 passes one of its four input values in response to the signals received from buffers 120 and 121. Table 1 sets forth the operation of programmable multiplexer 170.

TABLE 1

| Output of Buffer 120 | Output of Buffer 121 | Value passed by multiplexer 170 |
|---|---|---|
| 0 | 0 | 1 |
| 0 | 1 | 2 |
| 1 | 0 | −1 |
| 1 | 1 | 0 |

Figure 8:
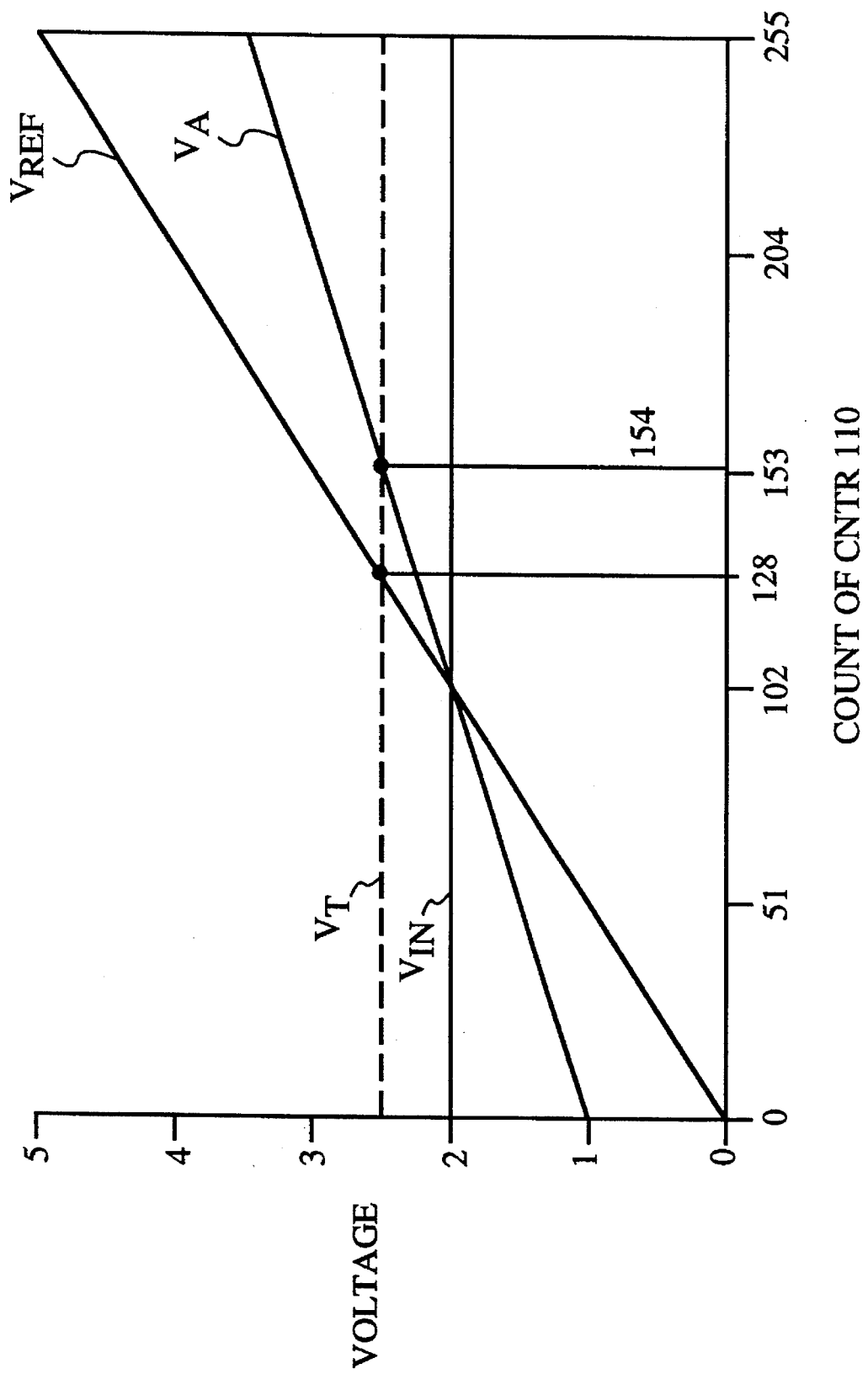
FIG. 8 is a waveform diagram illustrating operation of the digital logic circuits of FIGS. 6 and 7 when analog input signal $V_{IN}$ is less than threshold voltage $V_T$.

FIG. 8 is a waveform diagram illustrating the operation of the programmable counter formed by digital logic circuit 113 when analog input signal $V_{IN}$ is less than threshold voltage $V_T$. Because analog input signal $V_{IN}$ is sampled at a relatively high frequency, analog input signal $V_{IN}$ is virtually constant over a cycle of counter 110. The clock signal generated by clock signal generator 112 typically has a frequency in the range of 20–50 Mhz. In the example illustrated in FIG. 8, analog input signal $V_{IN}$ is 2 volts.

Initially, when the count of counter 110 is equal to zero, the value stored in register 172 of digital logic circuit 113 is also equal to zero. The output signals of buffers 120 and 121 are also equal to zero because neither analog control signal $V_A$ nor analog reference signal $V_{REF}$ has exceeded the threshold voltage $V_T$. Under these conditions, programmable multiplexer 170 passes a "1" signal to adder circuit 171. As a result, the value stored in register 172 (i.e., the count of counter 173) is incremented once during each clock cycle (i.e., during each count of counter 110). After analog reference signal VREF equals or exceeds threshold voltage $V_T$ (at count 128), the output signal of buffer 121 transitions to a logic high state. In response, programmable multiplexer 170 passes a "-1" signal to adder circuit 171. As a result, the value stored in register 172 begins decrementing from the current count (i.e., count 128) once during each clock cycle. This downward counting continues until analog control signal $V_A$ equals or exceeds threshold voltage $V_T$ (at count 154). At this point, the output signal of buffer 120 transitions to a logic high state. In response, programmable multiplexer 170 passes a "0" signal to adder circuit 171. As a result, the value stored in register 172 remains unchanged, effectively causing counter 173 to stop counting. The count held in register 172 is provided as a digital value on output bus 132. This current count is a digital value representative of the analog value of $V_{IN}$. In the present example, a digital output of 102 (128-(154–128)) is provided on output bus 132 in response to the 2 volt analog input signal $V_{IN}$. Note that when digitizing a 5 volt signal into 255 values, the desired digital value for a 2 volt signal is indeed 102 (2 volts * 255 values/5 volts).

Figure 9:
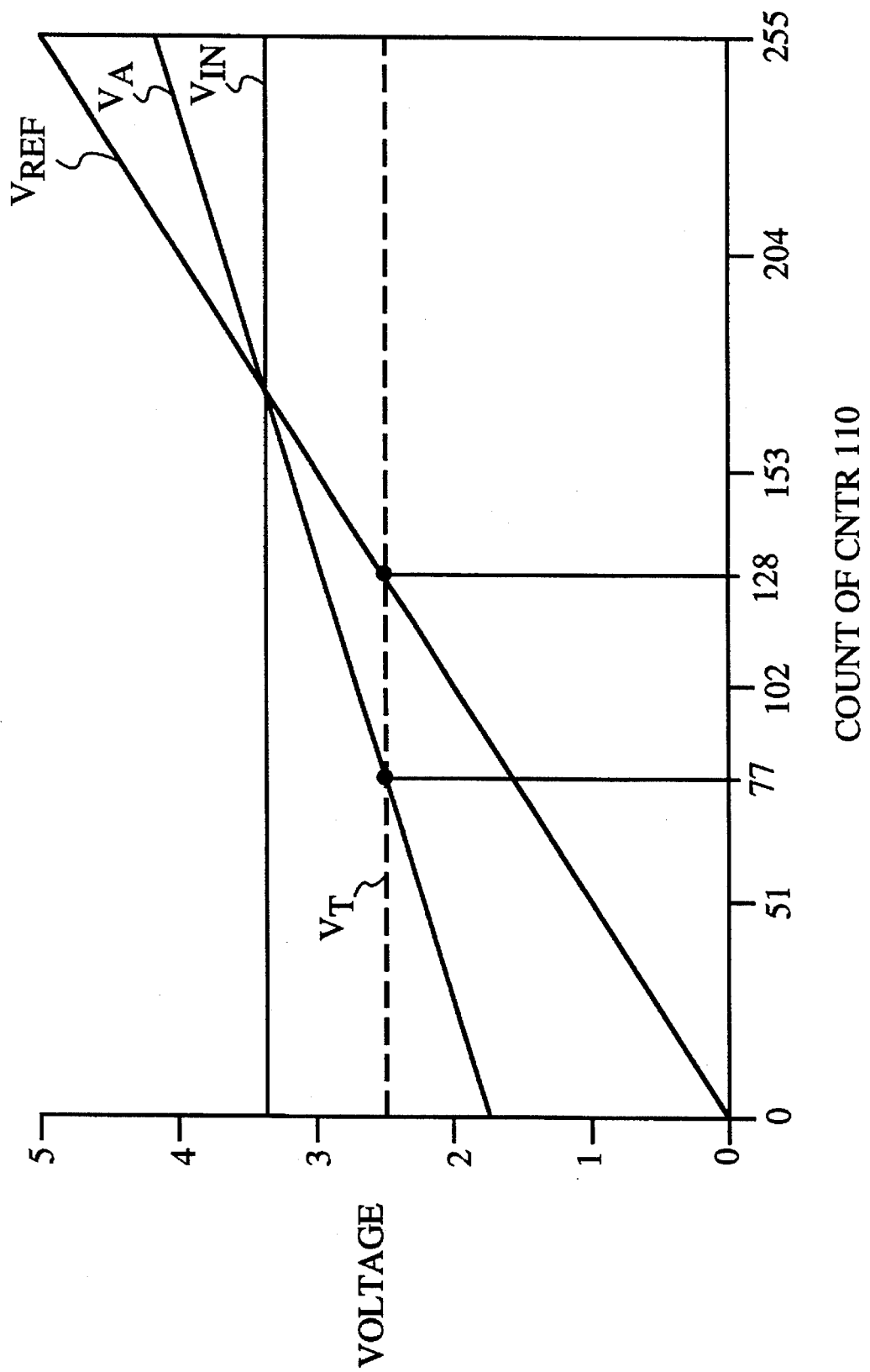
FIG. 9 is a waveform diagram illustrating the operation of the digital logic circuits of FIGS. 6 and 7 when analog input signal $V_{IN}$ is greater than threshold voltage $V_T$.

FIG. 9 is a waveform diagram illustrating the operation of digital logic circuit 113 when analog input signal $V_{IN}$ is greater than threshold voltage $V_T$. In the example illustrated in FIG. 9, analog input signal $V_{IN}$ is 3.5 volts.

As in the example previously described in connection with FIG. 8, when the count of counter 110 is equal to zero, a zero value is stored in register 172 of counter 173. The output signals of buffers 120 and 121 are at a logic low level. As a result, programmable multiplexer 170 initially passes the "1" signal to adder circuit 171 and the value stored in register 172 is incremented once during each clock cycle. After analog control signal $V_A$ equals or exceeds threshold voltage $V_T$ (at count 77), the output signal of buffer 120 transitions to a logic high state. In response, programmable multiplexer 170 passes the "2" signal to adder circuit 171. As a result, the value stored in register 172 begins incrementing twice during each clock cycle. This double incrementing continues until analog reference signal $V_{REF}$ equals or exceeds threshold voltage $V_T$ (at count 128). At this point, the output signal of buffer 121 transitions to a logic high state. In response, programmable multiplexer 170 passes a "0" signal to adder circuit 171, thereby holding the count in register 172. This count is a digital value representative of the analog value of $V_{IN}$. In the present example, a digital output of 179 (77+2 * (128−77)) is provided on output bus 132 in response to the 3.5 volt analog input signal $V_{IN}$. Note that when digitizing a 5 volt signal into 255 values, the desired digital value for a 3.5 volt signal is 179 (3.5 volts * 255 values/5 volts).

The operation of digital logic circuit 113 in accordance with the above-described embodiment of the present invention is summarized in Table 2 below.

TABLE 2

| $V_A >= V_T$ | $V_{REF} >= V_T$ | Operation performed by Counter 173 for each count of Counter 110 |
| --- | --- | --- |
| No | No | Increment by one |
| No | Yes | Increment by two |
| Yes | No | Decrement by one |
| Yes | Yes | Hold current count |

ADC 100 automatically compensates for variations in threshold voltage $V_T$. For example, if threshold voltage $V_T$ drops slightly, causing analog reference voltage $V_{REF}$ to equal or exceed the voltage threshold $V_T$ one count early, the analog control signal $V_A$ will equal or exceed the voltage threshold $V_T$ two counts early (because of the effect of resistors 102 and 103). Thus, in FIG. 8, the increment period is one count shorter (127= 128−1) and the decrement period is one count shorter (25= (154−2)127), thereby resulting in the same final count (102= 127−25). Similarly, in FIG. 9, the increment period is two counts shorter (75= 77−2) and the increment by two period is one count longer (52= (128−1)−75), thereby resulting in the same final count (179= 75+ (2 * 52)).

While the accuracy of ADC 100 is unaffected by variations in threshold voltage $V_T$, the range of analog input voltage $V_{IN}$ is affected by such variations. The count of counter 173 can be negative or exceed the maximum count of counter 110 as necessary to accommodate an analog input voltage $V_{IN}$ having a range of:

$2*V_T - V_{CC} \leq V_{IN} \leq 2*V_T$

The foregoing embodiments described in connection with FIGS. 2–9 can be used in connection with a chip having digital circuitry which has a CMOS voltage threshold of 2.5 volts.

In alternate embodiments of the present invention, the digital values generated by digital logic circuit 113 can be negative or can exceed the maximum count of counter 110 as necessary to accommodate an analog input signal $V_{IN}$ having both positive and negative values. In one such embodiment, digital logic circuit 113 is modified for operation with an analog voltage signal $V_{IN}$ which has a range of approximately +/- 5 volts. Digital logic circuit 113 provides an output signal having a value of 255 when $V_{IN}$ is at its maximum value (e.g., 5 volts), and an output signal having a value of -255 when $V_{IN}$ is at its minimum value (e.g., -5 volts). The actual range of the analog input voltage $V_{IN}$ in such an embodiment is:

$(3*V_T)-(2*V_{CC}) \leq V_{IN} \leq 3*V_T$.

In this embodiment, the chip which includes ADC 100 utilizes TTL based circuitry which has a voltage threshold $V_T$ of approximately 1.6 volts. Thus, buffers 120 and 121 each have a voltage threshold of 1.6 volts. Resistors 102 and 103 are modified such that $R_{102}=2 * R_{103}$. The analog control signal $V_A$ is then equal to $\frac{2}{3} * (V_{IN}+ V_{REF})$.

If "A" is defined as the count of counter 110 at which $V_A$ exceeds threshold voltage $V_T$, "B" is defined as the count of counter 110 at which the analog reference voltage $VRE_F$ exceeds the threshold voltage $V_T$, and "C" is defined as the count of counter 110 which is representative of the digital value of $V_{IN}$, then for this embodiment, digital logic circuit 113 is programmed in accordance with the following equation:

$C=(3*B)-(2*A)$.

Figure 10:
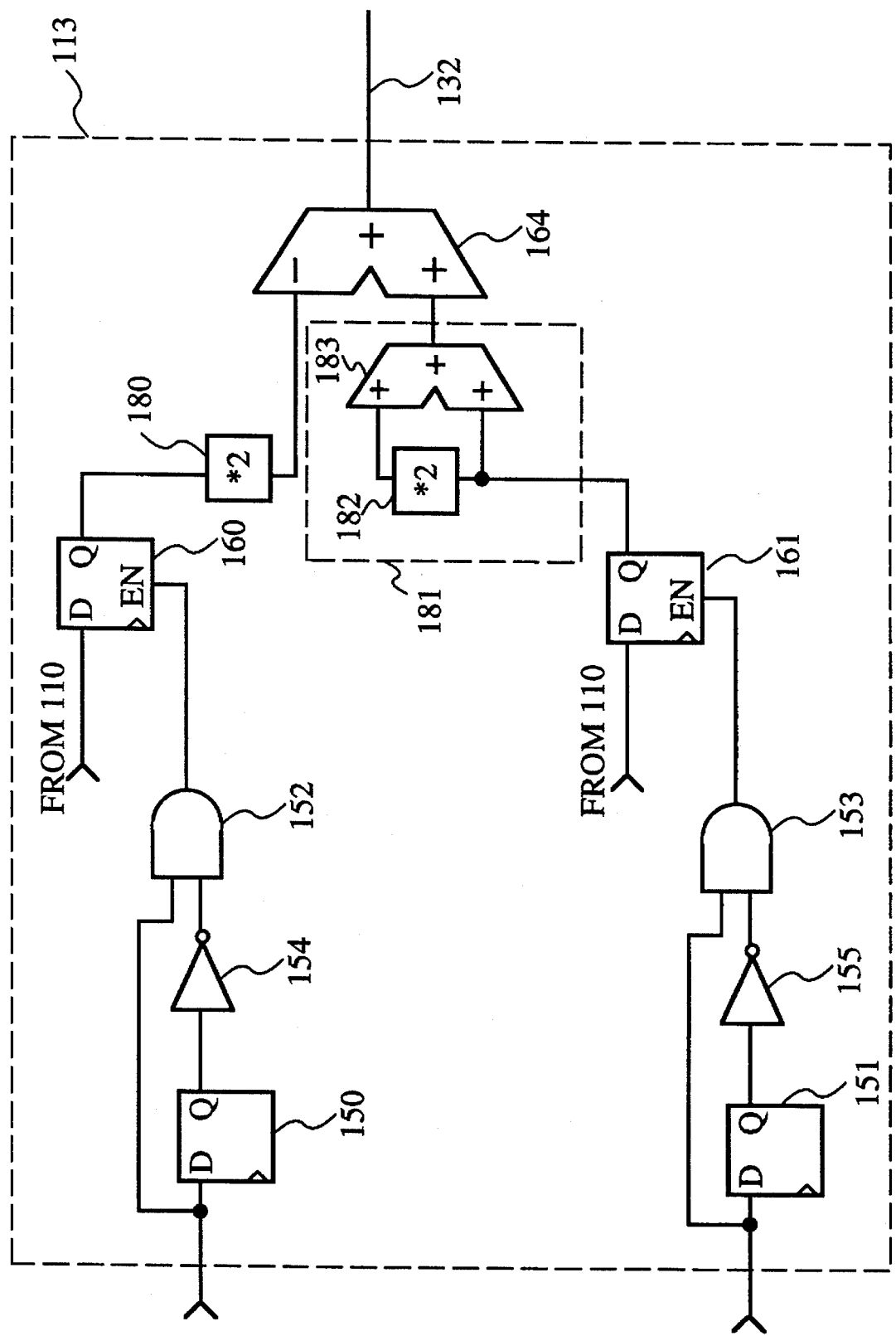
FIG. 10 is a schematic diagram of an alternate embodiment of the digital logic circuit of FIG. 2.

FIG. 10 illustrates a digital logic circuit 113 in accordance with the above described embodiment. The digital logic circuit illustrated in FIG. 10 is similar to the digital logic circuit previously illustrated in FIG. 6. Therefore, similar elements are labeled with similar numbers. The digital logic circuit of FIG. 10 includes a multiply-by-two circuit 180 between the Q output terminal of flip-flop 160 and the subtrahend input terminal of subtraction circuit 164. The digital logic circuit of FIG. 10 further includes a multiply-by-three circuit 181 between the Q output terminal of flip-flop 161 and the minuend input terminal of subtraction circuit 164. Multiply-by-three circuit 181 utilizes multiply-by-two circuit 182 and adder 183.

Figure 11:
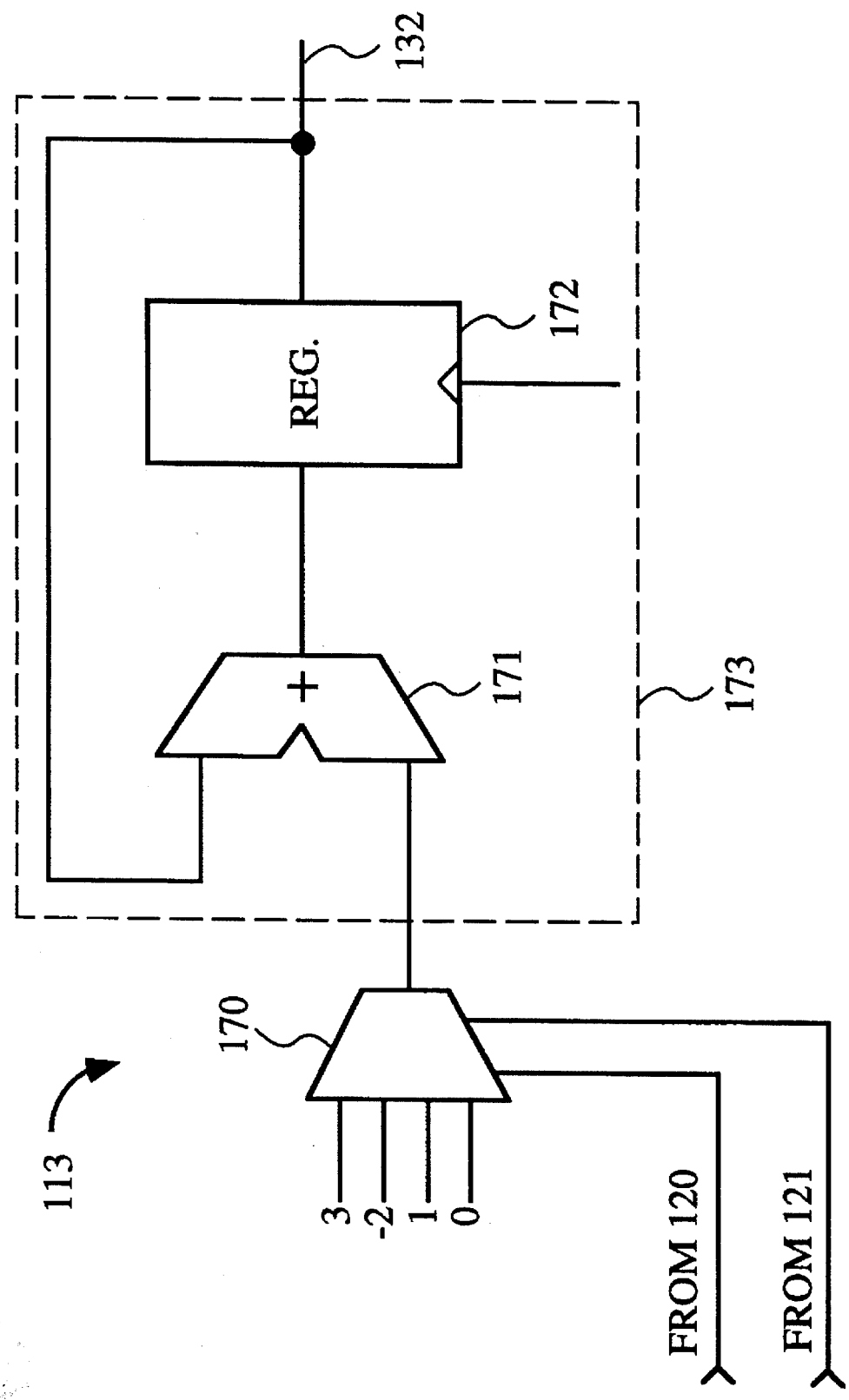
FIG. 11 is a schematic diagram of an alternate embodiment of the digital logic circuit of FIG. 2.

FIG. 11 is a schematic diagram of an alternate embodiment of digital logic circuit 113. In this embodiment, digital logic circuit 113 operates as a programmable counter. The digital logic circuit of FIG. 11 is similar to the digital logic circuit previously illustrated in FIG. 7. Therefore, similar elements are labeled with similar numbers. The digital logic circuit of FIG. 11 operates in a manner similar to the digital logic circuit of FIG. 7. However, the digital logic circuit of FIG. 11 utilizes a programmable multiplexer 190 which receives input signals having values of one, zero, three and minus two. The operation of the digital logic circuit 113 of FIG. 11 is summarized in Table 3 below.

TABLE 3

| Output of Buffer 120 | Output of Buffer 121 | Value Passed by Multiplexer 190 |
| --- | --- | --- |
| 0 | 0 | 1 |
| 0 | 1 | −2 |
| 1 | 0 | 3 |
| 1 | 1 | 0 |

Figure 12:
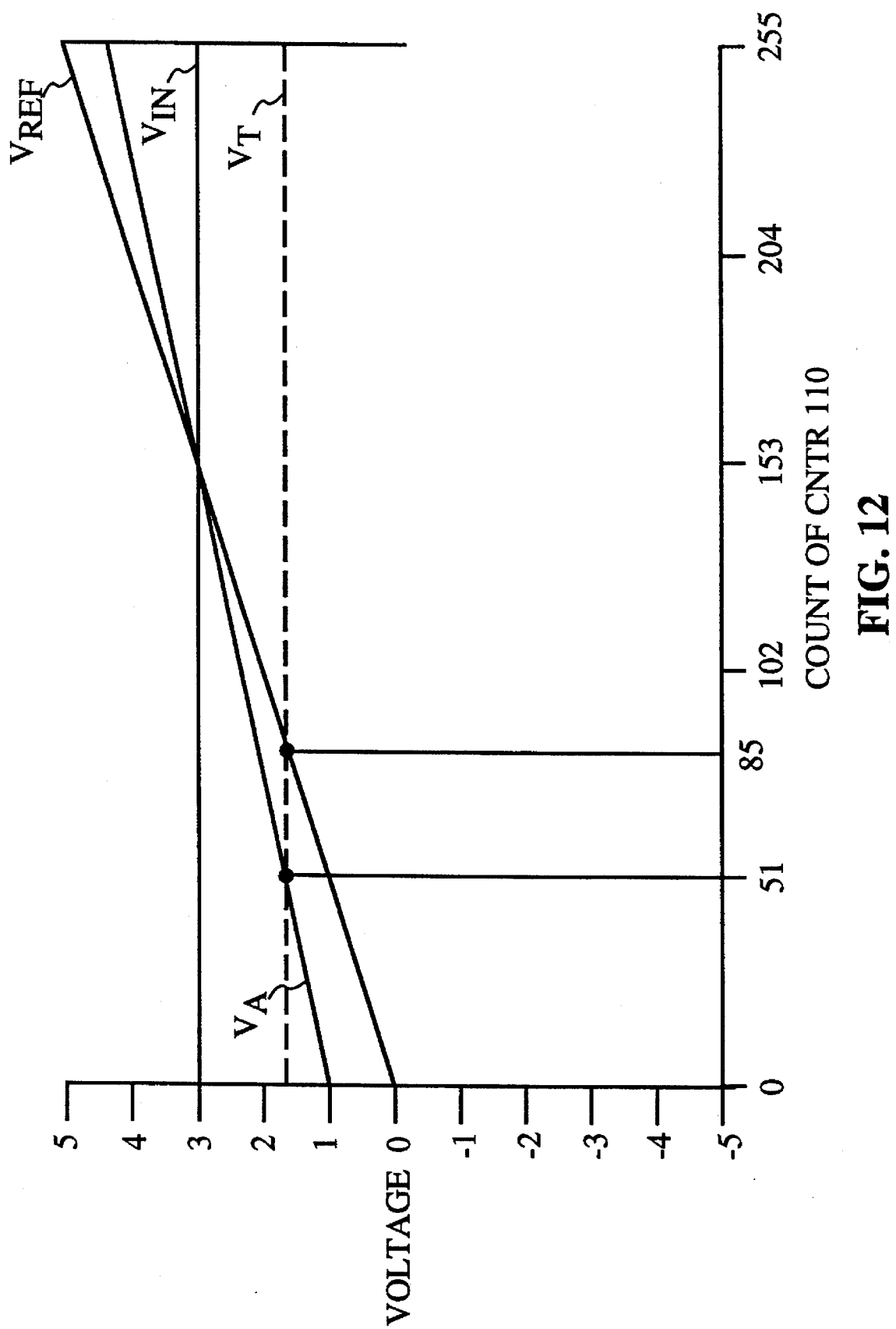
FIG. 12 is a waveform diagram which illustrates the operation of the digital logic cirucits of FIGS. 10 and 11.
Figure 13:
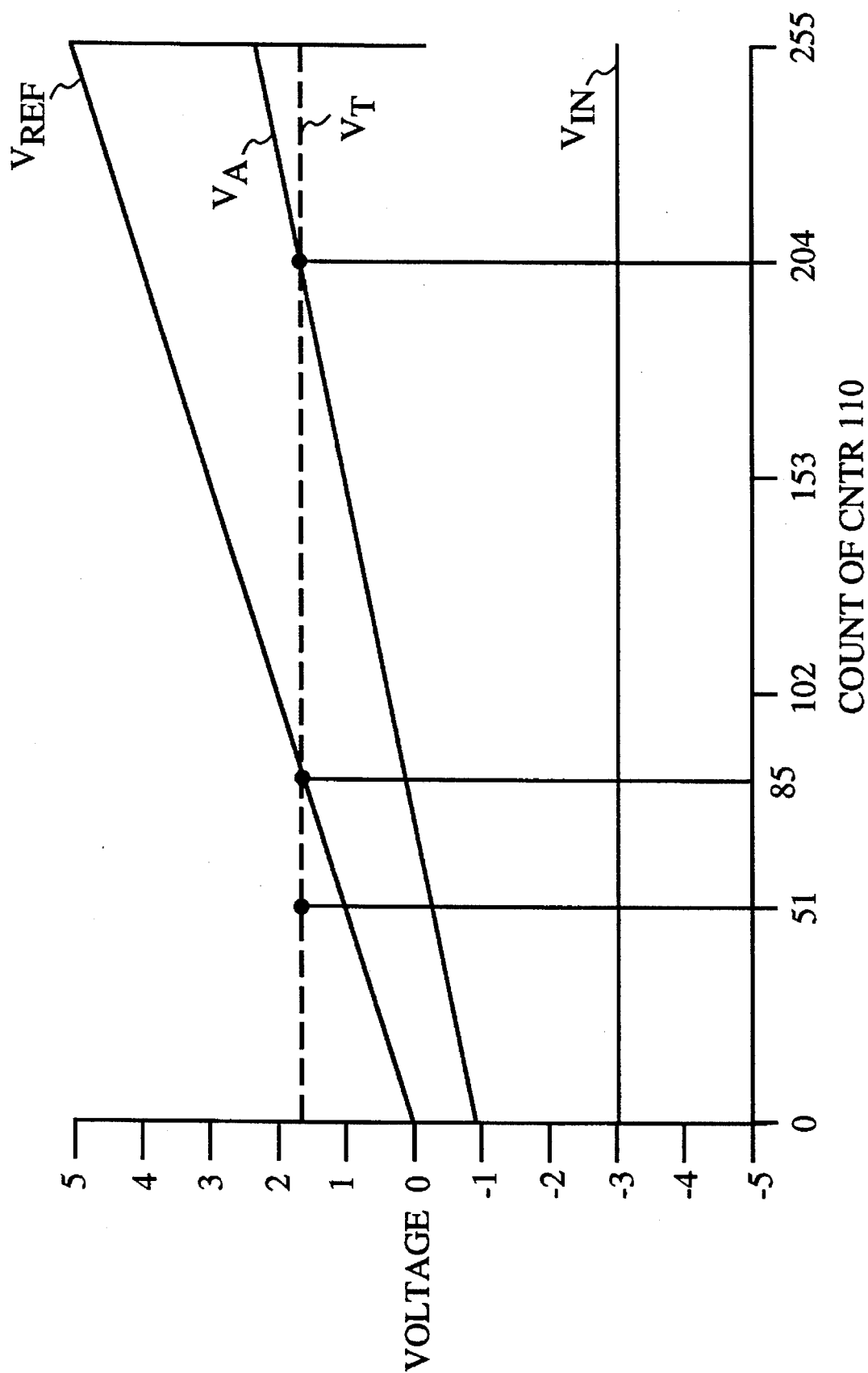
FIG. 13 is a waveform diagram which illustrates the operation of the digital logic circuits of FIGS. 10 and 11.

FIGS. 12 and 13 are waveform diagrams illustrating the operation of the digital logic circuit 113 of FIG. 11.

FIG. 12 is a waveform diagram which illustrates the operation of digital logic circuit 113 when the analog input signal $V_{IN}$ is at a level such that analog control signal $V_A$ equals or exceeds the threshold voltage $V_T$ before analog reference signal $V_{REF}$ equals or exceeds threshold voltage $V_T$. In FIG. 12, analog input signal $V_{IN}$ is 3 volts.

Initially, when the count of counter 110 is equal to zero, the count of counter 173 is also equal to zero. Counter 173 begins counting upward, incrementing once during each cycle of the system clock signal (i.e., once during each count of counter 110). After analog control signal $V_A$ equals or exceeds threshold voltage $V_T$ (at count 51), counter 173 begins counting upward, incrementing by three during each count of counter 110. This upward counting continues until analog reference signal $V_{REF}$ equals or exceeds threshold voltage $V_T$ (at count 85). At this point, counter 173 stops counting and holds the current count. This current count is a digital value representative of the analog value of $V_{IN}$. In the present o example, a digital output of 153 (51+3 * (85−51)) is provided on output bus 132 in response to the 3 volt analog input signal $V_{IN}$.

FIG. 13 iS a waveform diagram which illustrates the operation of digital logic circuit 113 when the analog input signal $V_{IN}$ iS at a level such that analog reference signal $V_{REF}$ equals or exceeds the threshold voltage $V_T$ before analog control signal $V_A$ equals or exceeds threshold voltage $V_T$. In FIG. 13, analog input signal $V_{IN}$ is −3 volts.

Again, when the count of counter 110 is equal to zero, counter 173 starts counting upward from zero, incrementing once during each count of counter 110. After analog reference signal $V_{REF}$ equals or exceeds threshold voltage $V_T$ (at count 85), counter 173 begins decrementing twice each count of counter 110. This decrementing continues until analog control signal VA equals or exceeds threshold voltage $V_T$ (at count 204). At this point, counter 173 stops counting and holds the current count. This current count is a digital value representative of the analog value of $V_{IN}$. In the present example, a digital output of -153 (85 2 * (204−85)) is provided on output bus 132 in response to the −3 volt analog input signal $V_{IN}$.

The operation of digital logic circuit 113 in lo accordance with the above-described embodiment of the present invention is summarized in Table 4 below.

TABLE 4

| $V_A >= V_T$ | $V_{REF} >= V_T$ | Operation performed by Counter 173 for each count of Counter 110 |
|---|---|---|
| No | No | Increment by one |
| No | Yes | Decrement by two |
| Yes | No | Increment by three |
| Yes | Yes | Hold current count |

While the present invention has been described in connection with particular embodiments, it is understood that the invention is not limited to the embodiments disclosed, but is capable of various modifications which would be apparent to one of ordinary skill in the art. For example, different threshold voltages and chip supply voltages may be used. The analog reference signal can also be modified to be a signal other than a ramp signal. In addition, the digital logic circuit can be modified to follow different instruction sets. Thus, the present invention is limited only by the following claims.

I claim:

1. An analog-to-digital converter comprising:

a clock signal generator having an output terminal;

a voltage generator having an input terminal coupled to the output terminal of said clock signal generator and an output terminal;

a voltage divider circuit having a first input terminal for receiving an analog input signal, a second input terminal coupled to the output terminal of said voltage generator, and an output terminal;

a first digital buffer having an input terminal coupled to the output terminal of said voltage divider circuit and an output terminal;

a second digital buffer having an input terminal coupled to the output terminal of said voltage generator and an output; and a digital logic circuit having a first input terminal coupled to the output terminal of said first digital buffer, a second input terminal coupled to the output terminal of said second digital buffer, a third input terminal coupled to the output terminal of said clock signal generator, and an output terminal for receiving a digital output signal.

2. The analog-to-digital converter of claim 1, wherein said voltage generator comprises:

a counter having an input terminal coupled to the output terminal of said clock signal generator and an output terminal; and a digital-to-analog converter having an input terminal coupled to the output terminal of said counter and an output terminal coupled to the second input terminal of said voltage divider circuit.

3. The analog-to-digital converter of claim 2, wherein said digital-to-analog converter further comprises:

a pulse width modulator circuit having a first input terminal coupled to the output terminal of said counter, a second input terminal coupled to the output terminal of said clock signal generator, and an output terminal;

a resistor coupled between the output terminal of said pulse width modulator and the second input terminal of said voltage divider circuit; and a capacitor coupled to the second input terminal of voltage divider circuit.

4. The analog-to-digital converter of claim 1, wherein said voltage divider circuit further comprises:

a first resistor having a first terminal coupled to the first input terminal of said voltage divider circuit and a second terminal connected to the output terminal of said voltage divider circuit; and a second resistor having a first terminal coupled to the second input terminal of said voltage divider circuit and a second terminal coupled to said output terminal of said voltage divider circuit.

5. The analog-to-digital converter of claim 4, wherein the resistance of said first resistor is substantially equal to the resistance of said second resistor.

6. The analog-to-digital converter of claim 4, wherein the resistance of said first resistor is approximately twice the resistance of said second resistor.

7. The analog-to-digital converter of claim 1, wherein said voltage generator provides a ramp signal at the output terminal of the voltage generator.

8. The analog-to-digital converter of claim 7, wherein said ramp signal increases from a first supply voltage to a second supply voltage and said ramp signal exceeds a threshold voltage when said ramp signal is at half of said second supply voltage.

9. The analog-to-digital converter of claim 1, wherein said voltage generator, said voltage divider circuit, said first and second digital buffers and said digital logic circuit are fabricated on a digital integrated circuit chip.

10. The analog-to-digital converter of claim 1, wherein said digital logic circuit comprises a programmable counter which generates a digital output signal in response to signals received on the first, second and third input terminals of said digital logic circuit.

11. The analog-to-digital converter of claim 10, wherein said programmable counter comprises:

a multiplexer having control terminals coupled to the output terminals of said first and second digital buffers, a plurality of input terminals for receiving a corresponding plurality of digital count signals, and an output terminal;

an counter circuit having an count input terminal coupled to the output terminal of said multiplexer, a clock input terminal coupled to said clock signal generator, and a count output terminal coupled to the output terminal of said digital logic circuit.

12. The analog-to-digital converter of claim 1, wherein said digital logic circuit comprises:

a first flip flop having a data input terminal coupled to said clock signal generator, an enable input terminal coupled to the output terminal of said first digital buffer, and an output terminal;

a second flip flop having a data input terminal coupled to said clock signal generator, an enable input terminal coupled to the output terminal of said second digital buffer, and an output terminal;

a first multiplier circuit having an input terminal coupled to the output terminal of said first flip flop and an output terminal;

a second multiplier circuit having an input terminal coupled to the output terminal of said second flip flop and an output terminal;

a subtraction circuit having input terminals coupled to the output terminals of said first and second multiplier circuits and an output terminal coupled to the output terminal of said digital logic circuit.

13. An analog-to-digital converter for generating a digital output signal in response to an analog input signal in a digital system having a threshold voltage, said analog-to-digital converter comprising:

a voltage generator which generates an analog reference signal in response to a clock signal;

a voltage divider circuit having a first node for receiving said analog input signal, a second node coupled to said voltage generator and an output node, wherein said voltage divider circuit provides an analog control signal at said output node which is equal to the sum of a predetermined fraction of said analog input signal and a predetermined fraction of said analog reference signal;

a first digital buffer for receiving said analog control signal, wherein said first digital buffer passes a digital control signal having a first logical state when said analog control signal is less than said threshold voltage and wherein said first digital buffer passes a digital control signal having a second logical state when said analog control signal is greater than said threshold voltage;

a second digital buffer for receiving said analog reference signal, wherein said second digital buffer passes a digital control signal having a first logical state when said analog reference signal is less than said threshold voltage and wherein said second digital buffer passes a digital control signal having a second logical state when said analog reference signal is greater than said threshold voltage;

a digital logic circuit having a first input node for receiving the digital control signal passed by said first digital buffer, a second input node for receiving the digital control signal passed by said second digital buffer and a third input node for receiving said clock signal, wherein said digital logic circuit generates a digital output signal representative of said analog input signal in response to the digital control signals passed by said first and second digital buffers and said clock signal.

14. The analog-to-digital converter of claim 13, wherein said voltage generator comprises:

a counter having an input node for receiving said clock signal and an output node; and a digital-to-analog converter having an input node coupled to the output node of said counter and an output node coupled to the second node of said voltage divider circuit.

15. The analog-to-digital converter of claim 13, wherein said digital-to-analog converter further comprises:

a pulse width modulator circuit having an input node coupled to the output node of said counter and an output node;

a resistor coupled between the output node of said pulse width modulator and the second node of said voltage divider circuit; and a capacitor coupled to the second node of said voltage divider circuit.

16. The analog-to-digital converter of claim 13, wherein said analog reference signal is a ramp signal.

17. The analog-to-digital converter of claim 16, wherein said analog reference signal increases from a first supply voltage to a second supply voltage and said ramp signal exceeds said threshold voltage when said ramp signal is at half of said second supply voltage.

18. The analog-to-digital converter of claim 13, wherein said voltage divider circuit further comprises:

a first resistor having a first terminal coupled to the first input node of said voltage divider circuit and a second terminal coupled to the output node of said voltage divider circuit; and a second resistor coupled between the second input node of said voltage divider circuit and the output node of the voltage divider circuit.

19. The analog-to-digital converter of claim 18, wherein the resistance of said first resistor is substantially equal to the resistance of said second resistor.

20. The analog-to-digital converter of claim 18, wherein the resistance of said first resistor is approximately twice the resistance of said second resistor.

21. The analog-to-digital converter of claim 13, wherein said voltage generator, said voltage divider circuit, said first and second digital buffers and said digital logic circuit are fabricated on a digital integrated circuit chip.

22. A method of converting an analog input signal to a digital output signal in a system having a threshold voltage, said method comprising the steps of:

generating an analog reference signal in response to a clock signal;

transmitting said analog reference signal to a first digital buffer;

using said first digital buffer to generate a first digital control signal having a first logical state if said analog reference signal is less than said threshold voltage and a second logical state if said analog reference signal is greater than said threshold voltage;

generating an analog control signal equal to the sum of a predetermined fraction of said analog reference signal and a predetermined fraction of said analog input signal;

transmitting said analog control signal to a second digital buffer;

using said second digital buffer to generate a second digital control signal having a first logical state if said analog control signal is less than said threshold voltage and a second logical state if said analog control signal is less than said threshold voltage;

transmitting the first and second digital control signals from said first and second buffers to a programmable counter;

clocking said programmable counter with said clock signal;

operating said programmable counter in accordance with a first instruction when said first and second digital control signals are at said first logical state;

operating said programmable counter in accordance with a second instruction when said first digital control signal is at said first logical state and said second digital control signal is at said second logical state;

operating said programmable counter in accordance with a third instruction when said first digital control signal is at said second logical state and said second digital control signal is at said first logical state; and operating said programmable counter in accordance with a fourth instruction when said first and second digital control signals are at said second logical state.

23. The method of claim 22, wherein said analog reference signal is a ramp signal.

24. The method of claim 22, wherein said step of generating said analog reference signal further comprises the steps of:

using a counter to generate a count from zero to a maximum count in response to said clock signal;

transmitting said count to a pulse width modulator; and filtering said analog voltage ramp signal with an R-C filter, thereby generating an analog ramp signal.

25. The method of claim 22, wherein said first instruction causes said programmable counter to increment once during each cycle of said clock signal.

26. The method of claim 25, wherein said second instruction causes said programmable counter to increment by two during each cycle of said clock signal, said third instruction causes said programmable counter to decrement by one during each cycle of said clock signal, and said fourth instruction causes said programmable counter to stop counting and provide the current count of said programmable counter as a value of said digital output signal.

27. The method of claim 25, wherein said second instruction causes said programmable counter to increment by three during each cycle of said clock signal, said third instruction causes said programmable counter to decrement by two during each cycle of said clock signal, and said fourth instruction causes said programmable counter to stop counting and provide the current count of said programmable counter as a value of said digital output signal.

28. A method of converting an analog input signal to a digital output signal in a system having a threshold voltage, said method comprising the steps of:

generating a count signal having a plurality of count values in response to a clock signal;

generating an analog reference signal in response to said count values;

transmitting said analog reference signal to a first digital buffer;

using said first digital buffer to generate a first digital control signal having a first logical state if said analog reference signal is less than said threshold voltage and a second logical state if said analog reference signal is greater than said threshold voltage;

generating an analog control signal equal to the sum of a predetermined fraction of said analog reference signal and a predetermined fraction of said analog input signal;

transmitting said analog control signal to a second digital buffer;

using said second digital buffer to generate a second digital control signal having a first logical state if said analog control signal is less than said threshold voltage and a second logical state if said analog control signal is less than said threshold voltage;

transmitting the first and second digital control signals from said first and second buffers to a digital logic circuit;

storing a first count value of said count signal in a first storage device in said digital logic circuit when said the first digital control signal transitions from the first logical state to the second logical state;

storing a second count value of said count signal in a second storage device in said digital logic circuit when said the second digital control signal transitions from the first logical state to the second logical state;

multiplying said first count value by a first factor to create a first multiplied count value;

multiplying said second count value by a second factor to create a second multiplied count value; and algebraically combining said first and second multiplied count values to create said digital output signal.

\* \* \* \* \*

UNITED STATES PATENT AND TRADEMARK OFFICE
CERTIFICATE OF CORRECTION

PATENT NO. : 5,502,440
DATED : March 26, 1996
INVENTOR(S) : Bernard J. New

It is certified that error appears in the above-identified patent and that said Letters Patent is hereby corrected as shown below:

Col. 6, line 65, "C=2*b-A" should read -- C=2*B-A --.

Col. 7, line 37, "163" should read -- 161 --.

Col. 9, line 44, "$2*V_T-V_{CC} \leq V_{IN} \leq 2*V_T$" should read -- $2*V_T-V_{CC} < V_{IN} < 2*V_T$ --.

Col. 9, line 63, "$(3*V_T)-(2*V_{CC}) \leq V_{IN} \leq 3*V_T$" should read -- $(3*V_T)-(2*V_{CC}) < V_{IN} < 3*V_T$ --.

Signed and Sealed this

Third Day of February, 1998

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,502,440
DATED : March 26, 1996
INVENTOR(S) : Bernard J. New

It is certified that error appears in the above-identified patent and that said Letters Patent is hereby corrected as shown below:

On the Title Page, please add Item [73] Assignee —Xilinx, Inc., San Jose, Calif.—

Signed and Sealed this

Fourteenth Day of April, 1998

Attest:

BRUCE LEHMAN

*Attesting Officer*  *Commissioner of Patents and Trademarks*